(12) United States Patent  
Okada

(10) Patent No.: US 7,829,375 B2
(45) Date of Patent: Nov. 9, 2010

(54) METHOD FOR MANUFACTURING ORGANIC THIN FILM TRANSISTOR AND ORGANIC THIN FILM TRANSISTOR

(75) Inventor: Masakazu Okada, Otsu (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 12/668,722

(22) PCT Filed: Jun. 23, 2008

(86) PCT No.: PCT/JP2008/061404

§ 371 (c)(1),
(2), (4) Date: Jan. 12, 2010

(87) PCT Pub. No.: WO2009/011204

PCT Pub. Date: Jan. 22, 2009

(65) Prior Publication Data

US 2010/0184252 A1    Jul. 22, 2010

(30) Foreign Application Priority Data

Jul. 18, 2007    (JP) ............................. 2007-186787

(51) Int. Cl.
*H01L 51/40* (2006.01)
(52) U.S. Cl. .................. 438/99; 257/40; 438/507
(58) Field of Classification Search .................. 438/99, 438/478, 492, 500, 502, 507, 509; 257/40
See application file for complete search history.

(56) References Cited

U.S. PATENT DOCUMENTS 7,462,514 B2 * 12/2008 Shiroguchi et al. .......... 438/149
2003/0047729 A1    3/2003 Hirai et al. ................. 257/40
2006/0081880 A1    4/2006 Miyazaki et al. ............ 257/200
2006/0131561 A1    6/2006 Hirai et al. ................. 257/40
2008/0171403 A1 *  7/2008 Masumoto et al. ........... 438/99

FOREIGN PATENT DOCUMENTS

| JP | 10-190001 A | 7/1998 |
| JP | 2003-179234 A | 6/2003 |
| JP | 2003-304014 A | 10/2003 |
| JP | 2004-266157 A | 9/2004 |
| JP | 2007-173472 A | 7/2007 |
| WO | WO 2004/075279 A1 | 9/2004 |
| WO | WO 2009/011204 A1 | 1/2009 |

OTHER PUBLICATIONS

C. D. Dimitrakopolus et al., "Organic Thin Film Transistors for Large Area Electronics", Advanced Materials, Jan. 16, 2002, 14, No. 2, pp. 99-117.
M. G. Kane et al., "6.5L: Late News Paper: AMLCDs using Organic Thin-Film Transistors on Polyester Substrates", SID 01 DIGEST, 2001, pp. 57-59.
A. Afzali et al. "High-Performance, Solution-Processed Organic Thin Film Transistors from a Novel Pentacene Precursor", Journal of American Chemical Society, 2002, vol. 124, No. 30, pp. 8812-8813.

* cited by examiner

*Primary Examiner*—Charles D Garber
*Assistant Examiner*—Reema Patel
(74) *Attorney, Agent, or Firm*—Sidley Austin LLP

(57) ABSTRACT

A method for manufacturing an organic thin film transistor having excellent characteristics by a simple process, and an organic thin film transistor are provided. In a manufacture method of an organic thin film transistor element having a gate electrode, a gate insulation layer, an organic semiconductor layer and a source electrode and a drain electrode on a support, the method is characterized by comprising a step for forming an organic semiconductor precursor layer by applying a solution in which an organic semiconductor precursor is dissolved, and a step for forming an organic semiconductor layer by converting the organic semiconductor precursor to an organic semiconductor by exposing the organic semiconductor precursor layer to a discharging gas in a plasma state.

9 Claims, 3 Drawing Sheets

FIG. 1.1
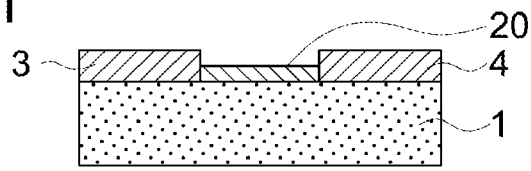
FIG. 1.2
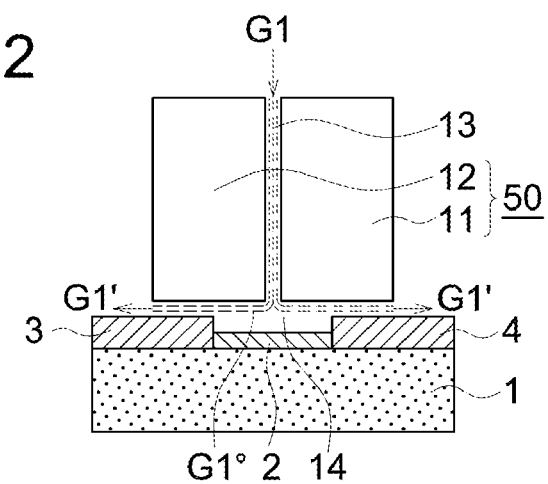
FIG. 1.3
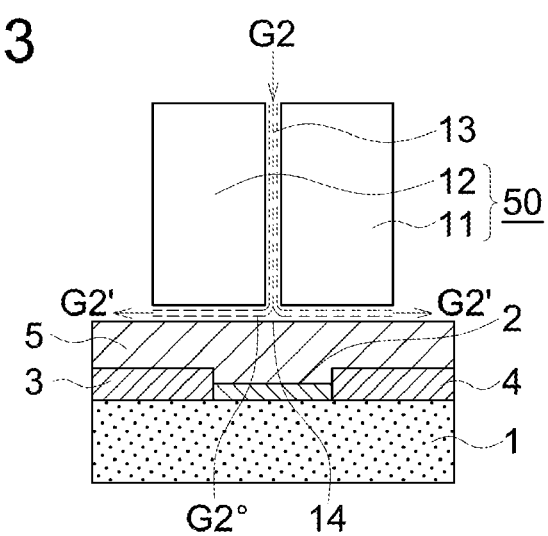
FIG. 1.4
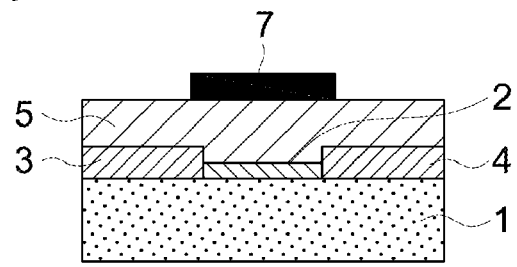

FIG. 4.1
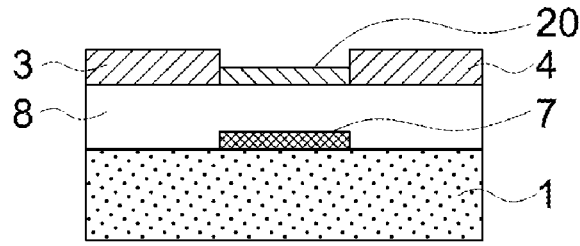
FIG. 4.2
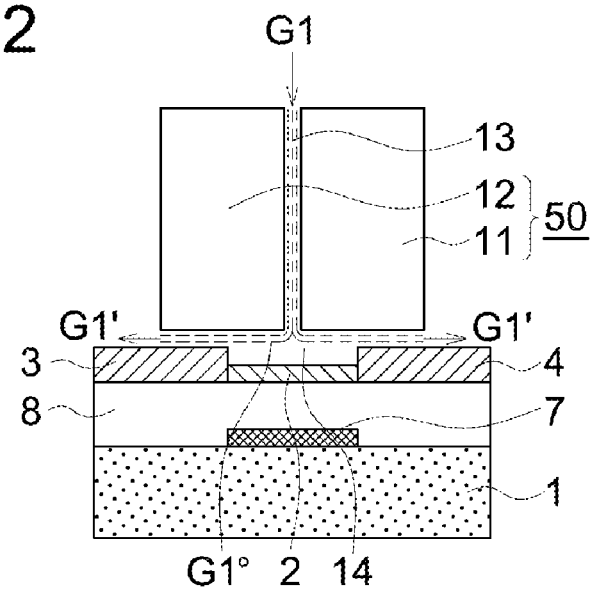
FIG. 4.3
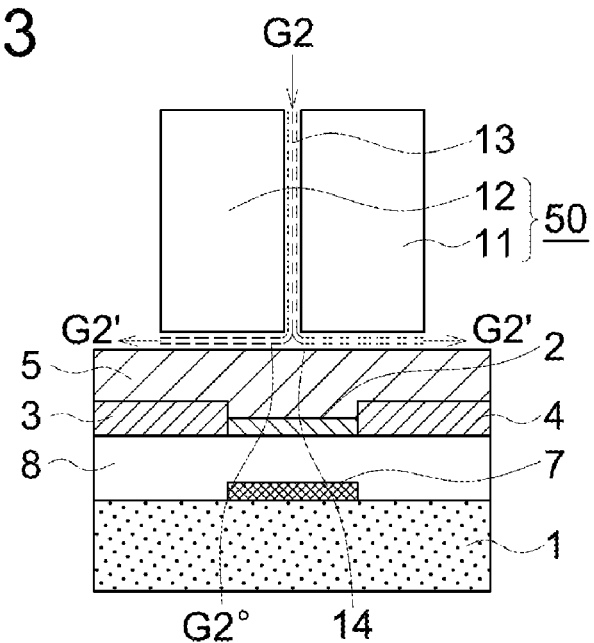

METHOD FOR MANUFACTURING ORGANIC THIN FILM TRANSISTOR AND ORGANIC THIN FILM TRANSISTOR

RELATED APPLICATIONS

This is a U.S. National Phase Application under 35 U.S.C. 371 of International Application PCT/JP2008/061404, filed on Jun. 23, 2008.

This application claims the priority of Japanese application No. 2007-186787, filed Jul. 18, 2007, the entire content of which is hereby incorporated by reference.

TECHNICAL FIELD

The present invention relates to a method for manufacturing an organic thin film transistor, and an organic thin film transistor.

BACKGROUND

Research and development of the organic TFT using organic semiconductor materials elements are progressed earnestly as technologies to complement do disadvantage of thin-film transistor (referred as TFT hereafter) element using conventional silicon material, recently (refer to Patent document 1, Non-patent document 1 and so on).

The organic TFT elements can be manufactured in a process at low temperature, and is available to use resin supports which is light and difficult to break, and further, a flexible display using resin film as a support can be realized (refer to non-patent document 2). A display of excellent productivity with low cost can be realized by using an organic semiconductor material which can be manufacturer by a wet process such as printing and coating at atmospheric pressure.

However, a layer of the organic semiconductor material is formed by vapor deposition such as employing a vacuum deposition method, since low molecular weight type organic semiconductor material having relatively high mobility is hard to be dissolved in a solvent. Further control of equipment or process is difficult since the manufacture is performed in by the vacuum condition a vacuum deposition method.

On the other hand, polymer type an organic semiconductor material excellent in solubility and suitable for a solution printing process such as an ink jet method and a spin coat method is low mobility and has a problem in reliability for long time.

An organic TFT is reported, in which organic TFT semiconductor layer is formed by forming a precursor film of soluble pentacene, which is a low molecular weight high mobility organic semiconductor material by a coating method, then it is converted to pentacene by heat treatment to improving the problems (refer to non-patent document 3).

Further, an organic TFT is reported in which semiconductor layer is formed by forming a soluble precursor of tetrabenzoporphyrin type compound semiconductor material by a coating method, then is converted crystalline porphyrin type compound semiconductor (refer to patent document 2).

Patent document 1: JP-A H10-190001
Patent document 2: JP-A 2003-304014
Non-patent document 1: Advanced Material, 2002, No. 2, page 99 (Review)
Non-patent document 2: SID' 01 Digest, page 57.
Non-patent document 3: Journal of American Chemical Society, 2002, No. 124, page 8812.

DESCRIPTION OF THE INVENTION

Problems to be Dissolved by the Invention

However the method described in the non-patent document 3 and patent document 2 is a conversion using reverse Dies-Alder reaction, it required to process at high temperature of 170° C. or higher, and therefore there is a possibility that the other components composed of organic materials deteriorates.

The present invention was performed in consideration of above problems, and an object is to provide a method for manufacturing an organic thin film transistor to manufacture an organic thin film transistor having excellent characteristics by a simple process, and an organic thin film transistor.

Technical Means to Dissolve the Problems

1. A method for manufacturing an organic thin film transistor comprising a gate electrode, a gate insulation layer, an organic semiconductor layer, a source electrode and a drain electrode on a support, the method comprising:
   a step for forming an organic semiconductor precursor layer by applying a solution in which an organic semiconductor precursor is dissolved, and
   a step for forming an organic semiconductor layer by converting the organic semiconductor precursor to an organic semiconductor by exposing the organic semiconductor precursor layer to discharging gas in a plasma state.

2. The method for manufacturing of an organic thin film transistor described in 1 above, wherein the step for forming an organic semiconductor layer is conducted by employing plasma discharge apparatus of a jet method, and exposing the organic semiconductor precursor layer to discharging gas in a plasma state blown from the plasma discharge apparatus.

3. The method for manufacturing of an organic thin film transistor described in 1. or 2. above, wherein the step for forming the organic semiconductor layer is conducted at atmospheric pressure or a pressure of a neighborhood of atmospheric pressure.

4. The method for manufacturing an organic thin film transistor described in 3. above, wherein the pressure is 20 kPa to 110 kPa.

5. The method for manufacturing an organic thin film transistor described in one of 1. to 4. above, wherein the discharging gas is $N_2$ gas containing $O_2$ and $H_2$ in concentration of not more than 100 ppm.

6. The method for manufacturing an organic thin film transistor described in one of 1. to 5. above, wherein the organic semiconductor precursor is a porphyrin type compound or a polyacene type compound.

7. The method for manufacturing an organic thin film transistor described in one of 1. to 6. above, the method comprising, after the step for forming the organic semiconductor layer, a step for forming an inorganic layer on the organic semiconductor layer by exposing the organic semiconductor layer to gas mixture of discharging gas, reactive gas and inorganic layer material gas in a plasma state blown from discharge apparatus.

8. The method for manufacturing an organic thin film transistor described in 7. above, wherein the step for forming the inorganic layer is conducted at atmospheric pressure or a pressure of a neighborhood of atmospheric pressure.

9. The method for manufacturing an organic thin film transistor described in 8. above, wherein the pressure is 20 kPa to 110 kPa.

10. An organic thin film transistor which is manufactured by employing the method described in any one of 1. to 9. above.

Advantage of the Invention

A manufacture a method for manufacturing an organic thin film transistor having excellent characteristics by a simple process and an organic thin film transistor can be provided since an organic semiconductor precursor layer is converted to an organic semiconductor layer by exposing the organic semiconductor precursor layer to a discharging gas in a plasma state blown by employing a plasma jet method.

BRIEF DESCRIPTION OF DRAWING

FIGS. 1.1-1.4: An explanation drawing to show one of the manufacture processes of a top gate type organic thin film transistor in relation to the present invention.

FIGS. 4.1-4.3: An explanation drawing showing one of methods manufacturing a bottom gate type organic TFT in relation to the present invention.

DESCRIPTION OF SYMBOLS

Figure 2:
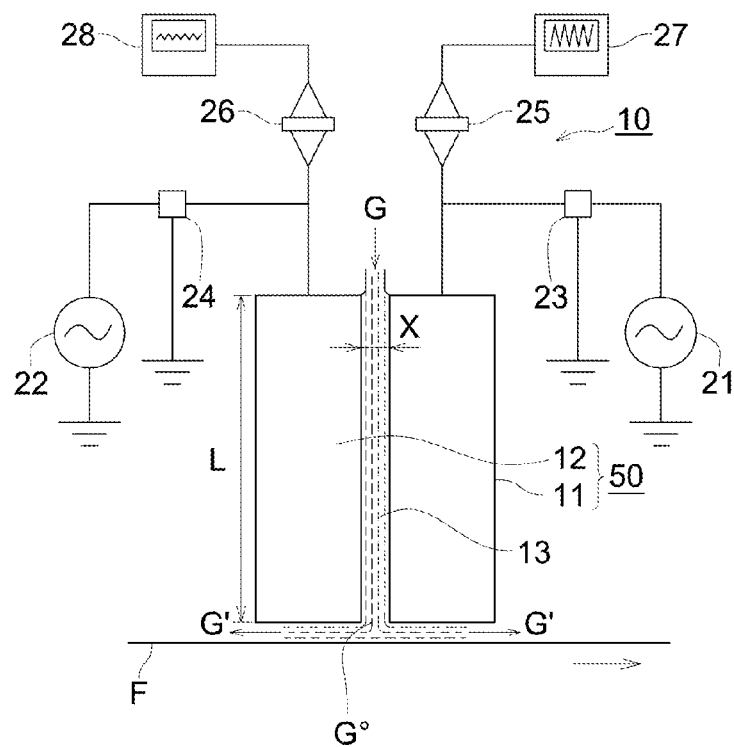
FIG. 2: A schematic view showing one of jet method plasma discharge apparatuses available to the present invention.

1: support
2: organic semiconductor layer
3: source electrode
4: drain electrode
5: inorganic layer
7: gate electrode
8: gate insulation layer
11: first electrode
12: second electrode
13: discharge space
20: an organic semiconductor precursor layer
50: counter-electrode

BEST EMBODIMENT IN PRACTICING THE INVENTION

The present invention is described by embodiments of the present invention in detail. The present invention is not limited to these.

FIG. 1 is an explanation drawing showing one methods of manufacturing a top gate type TFT in relation to the present invention, and FIG. 2 is an explanation drawing showing one of jet method plasma discharge apparatuses in relation to the present invention.

The following processes S1 to S4 are described as for one of manufacture methods a top gate type organic TFT in relation to the present invention.
S1: a step for forming an organic semiconductor precursor layer
S2: a step for forming an organic semiconductor layer
S3: a step for forming inorganic layer
S4: a step for forming a gate electrode A manufacturing method in case of forming a top gate type TFT is described according to FIG. 1, first, in the method, source electrode 3 and drain electrode 4 are provided on support 1, an organic semiconductor layer 2 and inorganic layer 5 are formed, and a gate electrode 7 is provided.

FIG. 1.1 to FIG. 1.4 are cross section views of a channel part of TFT formed on support 1.

After coating a photosensitive resist on support 1 provided with an electroconductive layer, a resist layer having each electrode pattern is formed by exposing through a photomask having patterns of source electrode 3 and drain electrode 4, and developing.

A raw material of support 1 is not particularly limited in the present invention. For example, glass and flexible resin sheet can be used. A usable electroconductive layer includes an electroconductive layer of low electrical resistance metal material such as Al, Cr, Ta, Mo and Ag, or multi-layer structure of these metals, formed on support 1 by using a method such as vapor deposition, sputtering and CVD method, and further, those doped with other material for the purpose of improving heat-resisting properties, improving adhesion properties to support 1, and preventing defects of metallic thin film. Further transparent electrodes such as ITO, IZO, SnO and ZnO can be employed.

Next, source electrode 3 and drain electrode 4 are formed by removing resist layer on source electrode 3 and drain electrode 4 after etching support, as shown in FIG. 1.1. The processes hitherto are not shown in FIG. 1. The process described above is an example and the present invention is not limited to these processes.

S1: Step for Forming Organic Semiconductor Precursor Layer 20

An organic semiconductor precursor material is coated pattern wise between source electrode 3 and drain electrode 4 formed on support 1, by known coating method, for example, an ink jet method.

The organic semiconductor precursor should be soluble in a solvent to form a film by employing a coating method or printing method. Examples of available soluble organic semiconductor precursor include, for example, a tetrabenzoporphyrin precursor, a pentacene precursor and a polyacene precursor. It is preferable to use porphyrin type compounds such as a tetrabenzoporphyrin precursor, polyacene type compounds such as pentacene precursor which can obtain high mobility and have excellent in storage stability for long time among them.

Structure formula of tetrabenzoporphyrin precursor and structure formula of tetrabenzoporphyrin after conversion are shown below.

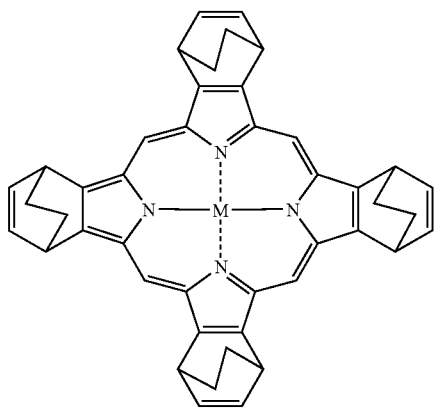

Tetrabenzoporphyrin precursor

-continued

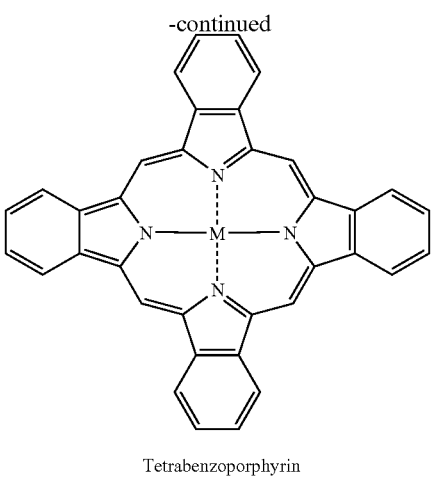

Tetrabenzoporphyrin

Structure formula of pentacene precursor and structure formula of pentacene after conversion are shown below.

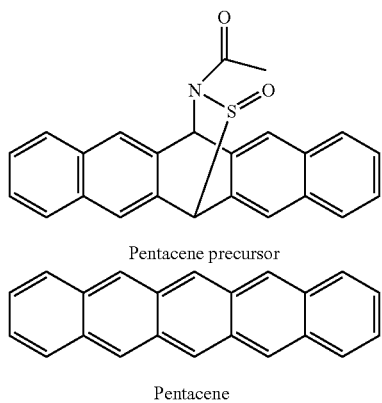

Pentacene precursor

Pentacene clohexane, m-dichlorobenzene, tetralin, chloroform, methoxybenzene and ethyl benzoate depending on spices of precursors.

S2: Step for Forming Organic Semiconductor Layer 2

Organic semiconductor layer 2 is formed by converting the organic semiconductor precursor to an organic semiconductor by exposing organic semiconductor precursor layer 20 to discharging gas in a plasma state blown from, for example, jet method plasma discharge apparatus 10 in this process. This process is not limited to a plasma jet method, and a direct plasma method can be used. A plasma jet method can convert to organic semiconductor with little damage to the organic insulation layer or electrodes by a simple process.

Jet method plasma discharge apparatus 10 is described below.

FIG. 2 is a schematic view showing an example of jet method plasma discharge apparatuses available for the present invention.

Jet method plasma discharge apparatus 10 has electric field applying means having two power source, in addition thereto, gas supplying means and electrode temperature control means, not shown in FIG. 2.

Plasma discharge apparatus 10 has counter-electrode 50 composed of first electrode 11 and second electrode 12. In the figure, L is height of electrodes of first electrode 11 and second electrode 12, and x is an electrode interval.

First high-frequency electric field of frequency ω1, electric field strength V1 and electric current I1 from first power source 21 is applied via first electrode 11, and second high-frequency electric field of frequency ω2, electric field strength V2 and electric current I2 from first power source 22, is applied via first electrode 11, to discharge space 13. The first power source 21 can apply high frequency electric field of higher strength than second power source 22 (V1>V2). The first frequency ω1 of the first power source 21 can apply lower frequency than first frequency ω1 of the second power source 22.

First filter 23 is provided between first electrode 11 and first power source 21, which is designed so that electric current from first power source 21 to first electrode 11 passes through easily, and electric current from second power source 22 to first power source 21 hardly passes through by grounding electric current from second power source 22.

Second filter 24 is provided between second electrode 12 and second power source 22, which is designed so that electric current from second power source 22 to second electrode passes through easily, and electric current from first power source 21 to second power source hardly passes through by grounding electric current from first power source 21.

Gas G is introduced into discharge space 13 between first electrode 11 and second electrode 12 from gas supplying means, and discharge is generated between first electrode 11 and second electrode 12 by applying high-frequency electric field. Then, gas G becomes in a plasma state, and blows out under counter-electrode 50 (under side of paper) in a jet state, and processing space formed by bottom surface of counter-electrode 50*a* and substrate F is filled with gas in a plasma state G°.

FIG. 2 illustrates a measuring instrument employed measuring the high frequency electric field strength (applying electric field strength) and the charge starting electric field strength, wherein 25 and 26 show high frequency voltage prove, 27 and 28 oscilloscope. The high frequency electric field strength of first power source 21 and second power source 22 is controlled by employing oscilloscope 27 and 28.

This process is conducted by employing jet method plasma discharge apparatus 10 shown in FIG. 2 at atmospheric pressure or a pressure of a neighborhood of atmospheric pressure. The pressure of atmospheric pressure or neighborhood of atmospheric pressure is 20 kPa to 110 kPa, and preferably about 93 kPa to 104 kPa.

FIG. 1.2 shows a process of exposing organic semiconductor precursor layer 20 to discharging gas in a plasma state G1° blown out from counter-electrode 50 of plasma discharge apparatus 10 so as to convert organic semiconductor layer 2. Discharging gas G1° is $N_2$ gas containing $O_2$ and $H_2$ of concentration not more than 100 ppm.

S3: Step for Forming Inorganic Layer 5

Inorganic layer 5 is formed by using jet method plasma discharge apparatus 10 at atmospheric pressure or a pressure of a neighborhood of atmospheric pressure as shown in FIG. 1.3. Pressure at atmospheric pressure or neighborhood of atmospheric pressure is 20 kPa to 110 kPa, preferably about 93 kPa to 104 kPa.

FIG. 1.3 shows a process of forming inorganic layer 5 on organic semiconductor layer 2 by exposing organic semiconductor layer 2 to gas G2° which is mixture of discharging gas, inorganic layer raw material gas and reactive gas in a plasma state blown from counter-electrode 50 of plasma discharge apparatus 10.

An example of forming an insulation layer of $SiO_2$ layer so that the inorganic layer 5 has a function of a gate insulation layer is described in the embodiment of the present invention.

Inorganic layer raw material gas for forming $SiO_2$ layer, for example, TEOS (tetraethoxysilane) is used, and, vaporized gas of TEOS by bubbling with the same species gas as the discharging gas is used as raw material gas G2. In the embodiment of the present invention argon is used as the discharging gas. As reactive gas, oxygen, for example, is used.

The raw material gas, discharging gas, and reactive gas are not limited to these and selected according to film species and condition to form.

Rare gas discharging gas such as argon, helium, neon and xenon can be used and, it is preferable particularly to use argon in view of reduced manufacturing cost. The other gas such as oxygen, nitrogen, carbon dioxide and hydrogen may be used in place of the above mentioned rare gas, and it is preferable to use nitrogen from view points of cost and environment.

Raw material gas used for forming inorganic layer 5 includes, for example, organic metal compounds, halogeno metal compounds and metal hydrogen compound. The organic metal compounds are preferably used in view of handling because of little danger of explosion, and in particular the organic metal compounds containing at least one oxygen atom in a molecule.

The organic metal compounds as a raw material gas used for forming an insulation layer include, for example, tetraethoxy silane, tetramethylsilane, tetraethoxysilane (TEOS), tetramethoxysilane (TMOS), trimethoxysilane(TMS), trimethylsilane (4MS) and hexamethyldisiloxane (HMDSO).

S4: Step for Forming Gate Electrode

Gate electrode 7 is formed by, for example, an addition patterning method. Raw materials applicable to the addition patterning method include, a liquid material dispersing nano particles of Ag (silver), Au (gold), Cu (copper), Pt (platinum) in a binder. FIG. 1.4 shows state in which gate electrode 7 is formed on inorganic layer 5.

The manufacture process of a top gate type TFT is described above.

A manufacture method conducting process S2 and process S3 continuously is described.

Figure 3:
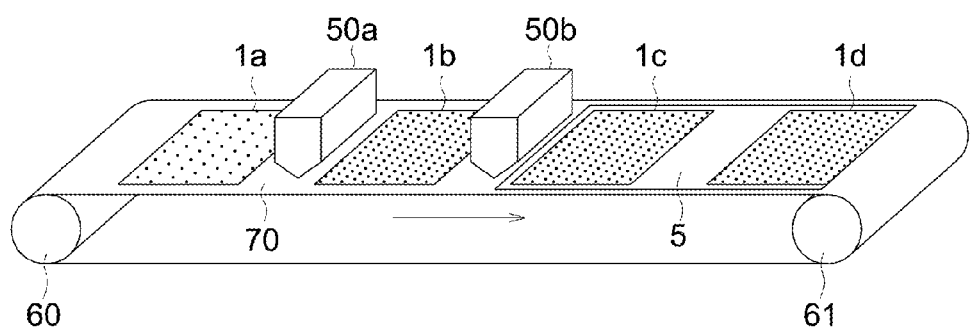
FIG. 3: A drawing explaining manufacture method to conduct process S2 and process S3 continuously.

FIG. 3 shows a drawing to illustrate a manufacture method conducting process S2 and process S3 continuously. Belt 70 is wound up from roller 60 by roller with a constant speed in direction of arrow, and support 1 placed belt 70 is conveyed.

Support 1a completed processes up to process S1, and illustrates a state in which plural source electrode 3, drain electrode 4 and organic semiconductor precursor 20 are formed on the support 1a in matrix state. In the figure, 50a is a counter-electrode of plasma discharge apparatus 10 used in a step for forming organic semiconductor layer 2 in process S2, and blows out discharging gas in a plasma state G1°.

Support 1b illustrates a state in which organic semiconductor precursor 20 is converted to organic semiconductor layer 2 by discharging gas in a plasma state G1° blown out from counter-electrode 50a. 50b is a counter-electrode of plasma discharge apparatus 10 used in a step for forming inorganic layer 5a in process S3, and blows out raw material gas G2° in a plasma state.

Support 1c illustrates a state in which inorganic layer 5 is formed on whole surface thereof by raw material gas G2° in a plasma state blown out from counter-electrode 50b.

Steps for forming an organic semiconductor layer in process S2 and a step for forming inorganic layer in process S3 can be conducted under condition of atmospheric pressure or neighborhood of atmospheric pressure continuously by using jet method plasma discharge apparatus 10, and organic TFT can be manufactured by simple equipment and process. Further, damage to other organic substance such as organic semiconductor layer 2 and support 1 made of a resin can be minimized since plasma gas blows only required area on support 1 by jet method plasma discharge apparatus 10.

The manufacture method of the organic TFT described by using FIG. 3 is not limited to apply a top gate type TFT but bottom gate type organic TFT.

Next, a manufacture method of bottom gate type organic TFT in relation to the present invention is described.

FIG. 4 shows a drawing to explain one of manufacture methods of bottom gate type organic TFT in relation to the present invention.

The manufacture process of the bottom gate type organic TFT shown in FIG. 4 described below is almost the same as each process described by using FIG. 2, and same symbols are given to common matters and explanation is excluded.

FIG. 4.1 to FIG. 4.3 show cross section view of channel part of TFT formed on support 1.

a resist layer having each electrode pattern is formed by coating photosensitive resist on support 1 formed an electroconductive layer, exposing through a photo-mask having pattern of gate electrode 7, and developing. Gate insulation layer 8 is formed by vapor deposition or plasma method to cover gate electrode 7, source electrode 3 and drain electrode 4 are formed on gate insulation layer 8 by an ink jet method.

The processes described herebefore are not shown in FIG. 4. The process described above is an example, and the present invention is not limited to processes.

The processes S1 to S3, which is one of manufacture methods of bottom gate type organic TFT in relation to the present invention is described as follows.

S1: Step for Forming an Organic Semiconductor Precursor Layer

Organic semiconductor precursor layer 20 is formed by pattern coating an organic semiconductor precursor material between source electrode 3 and drain electrode 4 on support 1 via known coating method, for example, an ink jet method, as shown in FIG. 4.1.

S2: Step for Forming Organic Semiconductor Layer

Organic semiconductor precursor layer 20 is converted to organic semiconductor layer 2 by exposing to discharging gas in a plasma state G1° blown out from counter-electrode 50 of plasma discharge apparatus 10, as shown in FIG. 4.2. The discharging gas G1° is $N_2$ gas containing $O_2$ and $H_2$ in concentration of not more than 100 ppm.

S3: Step for Forming Inorganic Layer

Inorganic layer 5 is formed by employing jet method plasma discharge apparatus 10 at atmospheric pressure or a pressure of a neighborhood of atmospheric pressure, as shown in FIG. 4.3. The atmospheric pressure or neighborhood of atmospheric pressure is 20 kPa to 110 kPa, and preferably about 93 kPa to about 104 kPa.

Manufacture process of the bottom gate type organic TFT is described above.

Example

Examples to confirm the advantage of the present invention are described. The present invention is not limited to these.

Example 1

Polyethersulfone (PES) support having an aluminum layer of 130 nm on the surface manufactured by Sumitomo Bakelite Co., Ltd. was used for support 1 in this example. In this example 100 (i.e., 10×10) of top gate type TFTs were formed on support.

Preparation of TFT

Source electrode 3, drain electrode 4 and source bus line are formed support 1 subjecting to patterning treatment by conducting usual photolithograph process.

The following processes are same as S1 to S4 described in FIG. 1, common matters are not described while number of each process is added.

S1: Step for forming organic semiconductor precursor layer
S2: Step for forming organic semiconductor layer
S3: Step for forming inorganic layer
S4: Step for forming gate electrode S1: Step for Forming Organic Semiconductor Precursor Layer Organic semiconductor precursor layer 20 is formed by ejecting chloroform solution of pentacene precursor by employing a piezo type ink jet method so as to cover channel between source electrode 3 and drain electrode 4 formed on support 1, then it was dried in a environment at 50° C. for 3 minutes of in nitrogen gas.

S2: Step for Forming an Organic Semiconductor Layer

The under surface of counter-electrode 50a and organic semiconductor precursor layer 20 were arranged so as to have an interval between them of 1.0 mm as shown in FIG. 3. Height of electrodes L of counter-electrode 50 was 13 mm, electrode interval x was 0.5 mm used in this example. Discharge was generated by applying high-frequency electric field of 30 W/cm$^2$ power of frequency 100 kHz from first power source 21 and second power source 22 to first electrode 11 and second electrode 12.

$N_2$ gas, in which concentration of $O_2$ and $H_2$ contained therein is adjust 100 ppm or less, is introduced to discharge space 13 between first electrode 11 and second electrode 12 at 20 slm from gas supplying means. Consequently, $N_2$ gas in a plasma state is blown out in a jet state to at support 1 side of counter-electrode 50a.

When support 1 heated at 90° C. is conveyed at 50 mm/min under counter-electrode 50a, pentacene precursor in organic semiconductor precursor layer 20 was converted to pentacene and organic semiconductor layer 2 was formed by subjected to exposure to processing space filled with $N_2$ gas in a plasma state.

S3: Step for Forming Inorganic Layer

An interval between the under surface of counter-electrode 50b and organic semiconductor precursor layer 20 was arranged so as to be 1.0 mm as shown in FIG. 3. Height of electrodes L is 13 mm, and electrode interval x was 0.5 mm in counter-electrode 50b used in this example. Discharge was generated by applying high-frequency electric field of 30 W/cm$^2$ power of frequency 100 kHz from first power source 21 and second power source 22 to first electrode 11 and second electrode 12.

Gas vaporized by bubbling TEOS (tetraethoxysilane) with same kind of gas as discharging gas was used for raw material gas for $SiO_2$ layer. Discharging gas was argon and reactive gas was $O_2$. Raw material gas, discharging gas and reactive gas were introduced into discharge space 13 between first electrode 11 and second electrode 12 at gas flow rate of 5 L/min, 20 L/min, and 0.1 L/min, respectively, from gas supplying means. Then, mixed gas in a plasma state was blown out to support 1 side of counter-electrode 50a in a jet state.

When support 1 heated at 90° C. is conveyed at 50 mm/min under counter-electrode 50b, organic semiconductor precursor layer 20 composed of pentacene precursor is converted to form inorganic layer 5 composed of $SiO_2$ layer by subjected to exposure to processing space filled with mixed gas in a plasma state.

S4: Step for Forming Gate Electrode

Gate electrode 7 was formed by ejecting liquid material of nano particles of Ag (silver) dispersed in a binder via an ink jet method.

TFT elements were finished by forming insulation film after process S4, and forming pixel electrodes of coating type ITO in this example.

Comparative Example 1

Polyethersulfone (PES) support having an aluminum layer of 130 nm on the surface manufactured by Sumitomo Bakelite Co., Ltd. was used for support 1, and 100 (i.e., 10×10) of top gate type TFTs were formed on support also in Comparative Example 1.

The difference process from example 1 is a step for forming an organic semiconductor layer inorganic layer and a step for forming, and only the difference is detailed.

Step for Forming an Organic Semiconductor Layer

Support 1 on which organic semiconductor precursor layer was formed by the same process S1 as in example 1 was heated to 170° C. by an oven, whereby pentacene precursor was converted to pentacene.

Step for Forming Inorganic Layer

Inorganic layer 5 was formed by employing polyimide type material via a spin coat method, and solvent component contained in inorganic layer 5 was dried by heating support 1 at predetermined temperature.

The steps after a step for forming a gate electrode etc. were conducted in the same condition as example 1 to finish a TFT element.

Result of Experiment

The result of experiment is summarized in Table 1. In this experiment 24 TFT elements were selected randomly from 100 TFT elements on support 1, performance was evaluated in each and average value was calculated. Evaluation items are mobility and ON/OFF electric current ratio (electric current value between source drains when TFT is ON/electric current value between source drains when TFT is OFF).

TABLE 1

| | Example 1 | Comparative Example 1 |
|---|---|---|
| Mobility (cm$^2$/V · sec) | 0.085 | 0.087 |
| ON/OFF electric current ratio | 579,000 | 88,600 |

It was confirmed from the result of experiment that mobility and ON/OFF electric current ratio of TFT element prepared in Example 1 is superior to TFT element prepared in Comparative Example 1. The reason why performance TFT elements prepared in Comparative Example 1 is inferior is considered that other components composed of organic materials deteriorate during heat treatment at 170° C. to convert to organic semiconductor in a step for forming organic semiconductor.

Example 2

In Example 2 tetrabenzoporphyrin precursor was employed for the organic semiconductor precursor. The manufacture was conducted in the same process condition as example 1 for others, and different points are mainly described.

Polyethersulfone (PES) support having an aluminum layer of 130 nm on the surface manufactured by Sumitomo Bakelite Co., Ltd. was used for support 1, and 100 (i.e., 10×10) of top gate type TFTs were formed on support also in Example 2.

S1: Step for Forming an Organic Semiconductor Precursor Layer

Organic semiconductor precursor layer 20 is formed by ejecting chloroform solution of tetrabenzoporphyrin precursor by employing a piezo type ink jet method so as to cover channel between source electrode 3 and drain electrode 4 formed on support 1, then it was dried in a environment at 25° C. for 10 minutes of in nitrogen gas.

S2: Step for Forming an Organic Semiconductor Layer

The under surface of counter-electrode 50a and organic semiconductor precursor layer 20 were arranged so as to have an interval between them of 1.0 mm as shown in FIG. 3. Height of electrodes L of counter-electrode 50 was 13 mm, electrode interval x was 0.5 mm used in this example. Discharge was generated by applying high-frequency electric field of 50 W/cm$^2$ power of frequency 100 kHz from first power source 21 and second power source 22 to first electrode 11 and second electrode 12.

$N_2$ gas, in which concentration of $O_2$ and $H_2$ contained therein is adjust 100 ppm or less, is introduced to discharge space 13 between first electrode 11 and second electrode 12 at 20 slm from gas supplying means. Consequently, $N_2$ gas in a plasma state is blown out in a jet state to at support 1 side of counter-electrode 50a.

When support 1 heated at 120° C. is conveyed at 50 mm/min under counter-electrode 50a, tetrabenzoporphyrin precursor in organic semiconductor precursor layer 20 is converted to tetrabenzoporphyrin and organic semiconductor layer 2 was formed by subjected to exposure to processing space filled with $N_2$ gas in a plasma state.

S3: Step for Forming Inorganic Layer

Inorganic layer 5 composed of $SiO_2$ layer was formed in the same condition as Example 1.

S4: Step for Forming a Gate Electrode

Gate electrode 7 was formed in the same condition as Example 1.

TFT elements were finished by forming insulation film after process S4, and forming pixel electrodes of coating type ITO.

Comparative Example 2

Polyethersulfone (PES) support having an aluminum layer of 130 nm on the surface manufactured by Sumitomo Bakelite Co., Ltd. was used for support 1, and 100 (i.e., 10×10) of top gate type TFTs were formed on support also in Comparative Example 2.

The difference process from example 2 is a step for forming an organic semiconductor layer inorganic layer and a step for forming, and only the difference is detailed.

Step for Forming an Organic Semiconductor Layer

Support 1 on which organic semiconductor precursor layer was formed by the same process S1 as in example 1 was heated to 170° C. by an oven, whereby tetrabenzoporphyrin precursor was converted to tetrabenzoporphyrin.

Step for Forming Inorganic Layer

Inorganic layer 5 was formed by employing polyimide type material via a spin coat method, and solvent component contained in inorganic layer 5 was dried by heating support 1 at predetermined temperature.

The steps after a step for forming a gate electrode etc. were conducted in the same condition as example 1 to finish a TFT element.

Result of Experiment

The result of experiment is summarized in Table 2. In this experiment 24 TFT elements were selected randomly from 100 TFT elements on support 1, performance was evaluated in each and average value was calculated. Evaluation items are mobility and ON/OFF electric current ratio (electric current value between source drains when TFT is ON/electric current value between source drains when TFT is OFF).

TABLE 2

| | Example 2 | Comparative Example 2 |
|---|---|---|
| Mobility (cm$^2$/V · sec) | 0.42 | 0.23 |
| ON/OFF electric current ratio | 622,000 | 138,000 |

It was confirmed from the result of experiment that mobility and ON/OFF electric current ratio of TFT element prepared in Example 2 is superior to TFT element prepared in Comparative Example 2. The reason why performance TFT elements prepared in Comparative Example 2 is inferior is considered that other components composed of organic materials deteriorate during heat treatment at 170° C. to convert to organic semiconductor in a step for forming organic semiconductor.

Components composed of an organic material do not deteriorate since an organic semiconductor precursor is converted to an organic semiconductor by exposing to plasma jet in examples 1 and 2 according to the present invention as demonstrated above. Further, TFT elements having excellent characteristics can be manufactured since inorganic layer is formed by a plasma jet method in which an organic semiconductor layer does not deteriorate.

A method for manufacturing an organic thin film transistor having excellent characteristics and an organic thin film transistor can be provided by a simple process according to the present invention as described above.

The invention claimed is:

1. A method for manufacturing an organic thin film transistor comprising a gate electrode, a gate insulation layer, an organic semiconductor layer, a source electrode and a drain electrode on a support, the method comprising:
    a step for forming an organic semiconductor precursor layer by applying a solution in which an organic semiconductor precursor is dissolved, and
    a step for forming an organic semiconductor layer by converting the organic semiconductor precursor to an organic semiconductor by exposing the organic semiconductor precursor layer to discharging gas in a plasma state.

2. The method for manufacturing an organic thin film transistor of claim 1, wherein the step for forming an organic semiconductor layer is conducted by exposing the organic semiconductor precursor layer to discharging gas in a plasma state blown from a plasma discharge apparatus of a jet method.

3. The method for manufacturing an organic thin film transistor of claim 1, wherein the step for forming the organic semiconductor layer is conducted at atmospheric pressure or a pressure of a neighborhood of atmospheric pressure.

4. The method for manufacturing an organic thin film transistor of claim 3, wherein the pressure is 20 kPa to 110 kPa.

5. The method for manufacturing an organic thin film transistor of claim 1, wherein the discharging gas is $N_2$ gas containing $O_2$ and $H_2$ in concentration of not more than 100 ppm.

6. The method for manufacturing an organic thin film transistor of claim 1, wherein the organic semiconductor precursor is a porphyrin compound or a polyacene compound.

7. The method for manufacturing an organic thin film transistor of claim 1, the method comprising, after the step for forming the organic semiconductor layer:

a step for forming an inorganic layer on the organic semiconductor layer by exposing the organic semiconductor layer to gas mixture of discharging gas, reactive gas and inorganic layer material gas in a plasma state blown from discharge apparatus.

8. The method for manufacturing an organic thin film transistor of claim 7, wherein the step for forming the inorganic layer is conducted at atmospheric pressure or a pressure of a neighborhood of atmospheric pressure.

9. The method for manufacturing an organic thin film transistor of claim 8, wherein the pressure is 20 kPa to 110 kPa.

* * * * *